(12) United States Patent
Ikhlef et al.

(10) Patent No.: US 8,736,008 B2
(45) Date of Patent: May 27, 2014

(54) PHOTODIODE ARRAY AND METHODS OF FABRICATION

(75) Inventors: Abdelaziz Ikhlef, Hartland, WI (US); Wen Li, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 16 days.

(21) Appl. No.: 13/343,165

(22) Filed: Jan. 4, 2012

(65) Prior Publication Data

US 2013/0168750 A1 Jul. 4, 2013

(51) Int. Cl.
*H01L 27/146* (2006.01)
*H01L 27/148* (2006.01)
*H01L 29/66* (2006.01)
*H01L 31/00* (2006.01)

(52) U.S. Cl.
USPC ........... 257/448; 257/233; 257/330; 257/446; 257/459

(58) Field of Classification Search
USPC ............................................ 257/448; 438/82
See application file for complete search history.

(56) References Cited

U.S. PATENT DOCUMENTS

| | | | |
|---|---|---|---|
| 5,886,353 A | 3/1999 | Spivey et al. | |
| 6,133,615 A * | 10/2000 | Guckel et al. | 257/446 |
| 6,943,409 B1 * | 9/2005 | Cheng et al. | 257/330 |
| 7,183,555 B2 | 2/2007 | Jarron | |
| 7,626,389 B2 | 12/2009 | Fiedler et al. | |
| 7,972,875 B2 | 7/2011 | Rogers et al. | |
| 2003/0122210 A1 * | 7/2003 | Cohen et al. | 257/465 |
| 2004/0084080 A1 * | 5/2004 | Sager et al. | 136/263 |
| 2006/0097290 A1 * | 5/2006 | Hietanen | 257/233 |
| 2007/0122948 A1 | 5/2007 | Wei et al. | |
| 2007/0138588 A1 * | 6/2007 | Wilson et al. | 257/458 |
| 2009/0065704 A1 | 3/2009 | Heringa et al. | |
| 2009/0184317 A1 | 7/2009 | Sanfilippo et al. | |
| 2009/0224352 A1 * | 9/2009 | Wilson et al. | 257/459 |
| 2009/0294803 A1 | 12/2009 | Nuzzo et al. | |
| 2010/0142782 A1 | 6/2010 | Juntunen et al. | |
| 2011/0024711 A1 | 2/2011 | Li et al. | |
| 2011/0042576 A1 * | 2/2011 | Wilson et al. | 250/370.11 |
| 2011/0249148 A1 | 10/2011 | Prescher et al. | |
| 2012/0009722 A1 | 1/2012 | Sanfilippo et al. | |
| 2012/0146172 A1 | 6/2012 | Carey et al. | |
| 2013/0001426 A1 | 1/2013 | Tredwell et al. | |

* cited by examiner

*Primary Examiner* — Long K Tran
*Assistant Examiner* — Dzung Tran
(74) *Attorney, Agent, or Firm* — The Small Patent Law Group; Dean D. Small

(57) ABSTRACT

Photodiode arrays and methods of fabrication are provided. One photodiode array includes a silicon wafer having a first surface and an opposite second surface and a plurality of conductive vias through the silicon wafer. The photodiode array further includes a patterned doped epitaxial layer on the first surface, wherein the patterned doped epitaxial layer and the substrate form a plurality of diode junctions. A patterned etching defines an array of the diode junctions.

20 Claims, 6 Drawing Sheets

PHOTODIODE ARRAY AND METHODS OF FABRICATION

BACKGROUND OF THE INVENTION

Photodiodes are used in many different applications. For example, photodiodes may be used as part of detectors in imaging systems, such as x-ray imaging systems. In these x-ray imaging systems, x-rays produced by a source travel through an object being imaged and are detected by the detectors. In response thereto, the detectors (that include photodiodes) produce digital signals that represent the sensed energy used for subsequent processing and image reconstruction.

In known photodiode fabrication using a semiconductor wafer, an ion implant process is typically used to form the diode junction and a metal process (e.g., metallization process) is used to make electric connections. After the metal process, the wafer can no longer go through any high temperature processes used for semiconductor device fabrications. For example, the metalized portions cannot tolerate the high temperatures used for thermal oxide growth and/or ion implant activation. Accordingly, when forming a detector with an integrated diode/readout electronics device, fabrication on both sides of the semiconductor wafer involves metal processes at both sides of the wafer, such that a coordinated double-side photolithography process needs to be used. This process is not within standard complementary metal-oxide-semiconductor (CMOS) fabrication capabilities, as well as adds complexity and cost to the fabrication process.

Thus, known photodiode fabrication processes for forming devices for particular applications, such as detectors with integrated photodiode/readout electronics fabrication on both sides of the wafer for imaging systems, are directly related to the added complexity and cost of the overall process.

BRIEF DESCRIPTION OF THE INVENTION

In one embodiment, a photodiode array is provided that includes a silicon wafer having a first surface and an opposite second surface and a plurality of conductive vias through the silicon wafer. The photodiode array further includes a doped epitaxial layer on the first surface, wherein the doped epitaxial layer and the substrate form a plurality of diode junctions. A patterned etching defines an array of the diode junctions.

In another embodiment, a detector is provided that includes a silicon wafer having a first surface and an opposite second surface, a plurality of conductive vias through the silicon wafer and a plurality of photodiodes formed at the first surface without metal. The detector further includes readout electronics formed on the opposite second surface, wherein the plurality of photodiodes and the readout electronics are electrically connected by the plurality of conductive vias.

In yet another embodiment, a method for fabricating a photodiode array is provided. The method includes pre-processing a silicon wafer using a conductive through-silicon-via process and depositing a doped epitaxial layer on a surface of the pre-processed silicon wafer to form a plurality of diode junctions. The method further includes etching a pattern on the surface to define an array of the diode junctions.

DETAILED DESCRIPTION OF THE INVENTION

Figure 1:
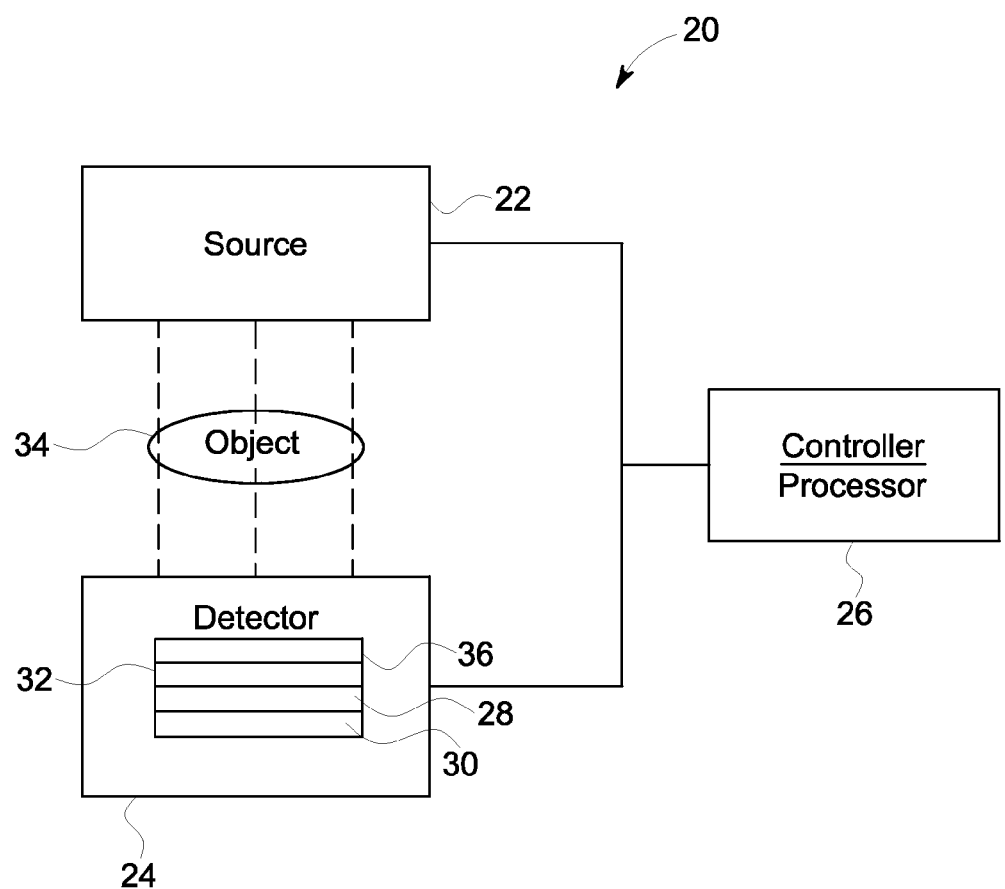
FIG. 1 is a simplified schematic block diagram of an exemplary embodiment of an imaging system.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Also as used herein, the term "reconstructing" or "rendering" an image or data set is not intended to exclude embodiments in which data representing an image is generated, but a viewable image is not. Therefore, as used herein the term "image" broadly refers to both viewable images and data representing a viewable image. However, some embodiments generate, or are configured to generate, at least one viewable image. In an exemplary embodiment, the "object" being imaged is a human individual. However, the object may alternatively be of another living creature besides a human individual. Moreover, the object is not limited to living creatures, but rather may be of inanimate objects, such as, but not limited to, luggage, shipping containers, and/or the like.

Various embodiments provide methods and systems for forming or fabricating photodiode arrays, such as a front-lit through-via (FLTV) photodiode array having diode junctions formed by epitaxial deposition (also referred to as epi-deposition). In various embodiments, the forming of the diode junction and electrical connections are provided in a single process not involving metal. By practicing at least one embodiment, photodiode fabrication on one side of a wafer can be completed first and then electronic component fabrication is performed at the other side of the wafer. Thus, in various embodiments, a coordinated double-sided photolithography process is not needed and the entire fabrication process flow can be made complementary metal-oxide-semiconductor (CMOS) compatible, such as the fabrication of other components (e.g., readout electronics) at the other side of the wafer. By practicing various embodiments, a front side (photodiode side) process enables high temperature subsequent process steps.

The various embodiments may provide a photodiode array with electronics for use in a detector for imaging applications. For example, the photodiode array may be used with imaging systems, which are described herein in connection with computed tomography (CT) systems. However, the various embodiments may be implemented in connection with different types of imaging systems, such as positron emission tomography (PET) systems and nuclear medicine systems, such as single-photon emission computed tomography (SPECT) systems, as well as other types of imaging systems. Applications of imaging systems include medical applications, security applications, industrial inspection applications, and/or the like. Thus, although embodiments are described and illustrated herein with respect to a CT imaging system having detectors that detect x-rays, the various embodiments may be used with any other imaging modalities and may be used to detect, for example, any other type of electromagnetic energy. Moreover, the various embodiments described and/or illustrated herein are applicable with single slice and/or multi-slice configured systems.

Referring now to FIG. 1, a detector having a photodiode array formed in accordance with various embodiments may be used in an imaging system 20 that includes a source 22 of electromagnetic energy, one or more detectors 24, and a controller/processor 26. The one or more detectors 24 also include a photosensor array, which in various embodiments is a photodiode array 28, and readout electronics 30 (e.g., an analog-to-digital (A/D) converter to convert an analog signal current into a digital signal, or a combination of an amplifier and an A/D converter with the amplifier to convert an analog signal current into an analog voltage signal and the A/D converter to convert the voltage signal into a digital signal). In one embodiment, the photodiode array 28 and readout electronics 30 in various embodiments are formed on two different sides of the same silicon wafer (at different times) with interconnections provided with conductive vias as described in more detail herein. A post-object collimator 36 (e.g., a post-patient collimator) and a scintillator 32 is also provided as described in more detail below.

The controller/processor 26 may provide power and/or timing control signals to the source 22. The detector 24 senses energy emitted by the source 22 that has passed through an object 34 being imaged and the post-object collimator 36. In response thereto, the scintillator 32 converts the x-rays received into optical photons, and the photosensor array, in particular, the photodiode array 28 converts the optical photons into electrical current signals that represent the sensed energy. The readout electronics 30, such as A/D converters, sample the analog current signals received from the photodiode array 28 and converts the data to digital signals. The controller/processor 26 performs subsequent processing and image reconstruction using the received digital signals. The reconstructed image may be stored and/or displayed by the controller/processor 26 and/or another device.

In various embodiments, the detector 24 is an indirect conversion detector wherein the scintillator 32 converts electromagnetic energy into visible (or near-UV) light photons, which are then converted to electrical analog signals by the photodiode array 28. The detector 24 may be any type of indirect conversion detector, such as, but not limited to, any detector with high density rare-earth ceramic scintillators.

One embodiment for fabricating the photodiode array 28 and readout electronics 30 are illustrated in FIGS. 2 through 5. These Figures generally illustrate the steps for fabricating the photodiode array 28 and readout electronics 30. It should be noted that the steps corresponding to each of FIGS. 2 through 5 may be performed sequentially. However, it should be noted that one or more of the steps may be performed concurrently or in a different order.

Figure 2:
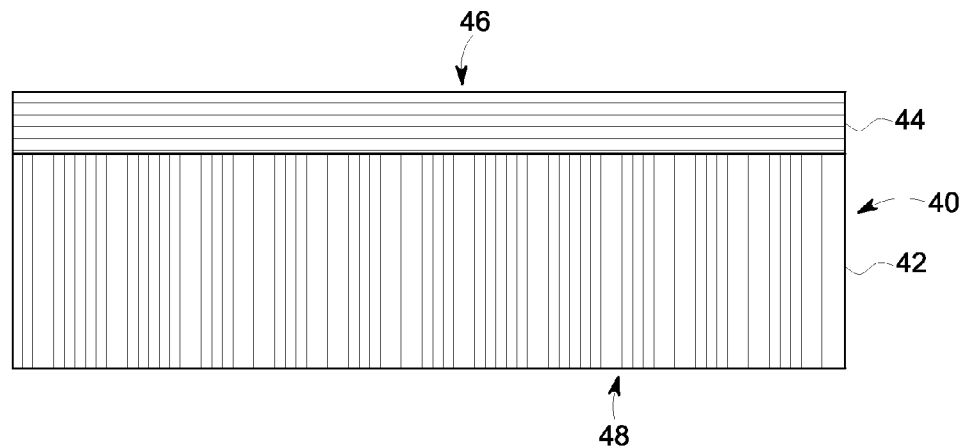
FIGS. 2-5 are diagrams illustrating a process for fabricating a photodiode array and readout electronics in accordance with various embodiments.

The fabrication process illustrated uses no ion implant process to form a photodiode junction. Additionally, no metal process is used to connect the photodiode to the through-silicon via (TSV). In particular, FIG. 2 illustrates a wafer used for the fabrication process. In one embodiment, a silicon wafer 40 is used, such as an epitaxial wafer (epi-wafer). The epi-wafer may be any wafer of semiconducting material formed by epitaxial growth (also referred to as epitaxy). The epi-wafer may be formed from any suitable method such as growing the epitaxial layer on an existing silicon substrate or using direct silicon-to-silicon bonding. The epi-wafer may be formed from different materials, such as semiconductor materials including gallium nitride (GaN), with different dopants such as gallium, indium, aluminum, nitrogen, phosphorus or arsenic, or combinations thereof, among others.

In one embodiment, the silicon wafer 40 is a multilayer wafer that includes a substrate layer 42 and a high resistivity layer 44 (e.g., greater than 800 ohm-cm). For example, the high resistivity layer 44 in various embodiments is a high resistivity device layer that may have a resistivity suitable for fabrication of the photodiode array 28, such as a zero bias PIN diode array. In one embodiment, the silicon wafer 40 may be formed from two layers of silicon material. For example, the substrate layer 42 may be formed from an N+ doped substrate material having a resistivity suitable for fabricating CMOS mixed signal readout electronics, such as the readout electronics 30. The high resistivity layer 44 may be formed as a high resistivity epi-layer, such as a high resistivity N-type bulk material, for example, a phosphorus doped material. In various embodiments, the multi-layer structure may be formed from process steps that include epi deposition, oxidation, diffusion, bonding, polishing and etching.

Thus, the substrate layer 42 has the same doping type as the high resistivity layer 44, but with a lower resistivity. Accordingly, in the illustrated embodiment, the substrate layer 42 and the high resistivity layer 44 are both n-doped layers (e.g., layers doped with an n-type dopant such as phosphorus). However, it should be noted that in other embodiments the substrate layer 42 and the high resistivity layer 44 may be p-doped layers (e.g., a layer doped with a p-type dopant such as boron). In various embodiments, the doping type of the substrate layer 42 and the high resistivity layer 44 are the same. Accordingly, in one embodiment, the substrate layer 42 and the high resistivity layer 44 are N+ doped and N doped layers, respectively. In another embodiment, the substrate layer 42 and the high resistivity layer 44 are P+ doped and P doped layers, respectively.

It should be noted that in various embodiments, for example, when using the fabrication process to form a back-connected two-dimensional (2D) tileable front-lit photodiode array, which may be embodied as the photodiode array 28, the substrate layer 42 is on an interconnection side 48 and the high resistivity layer 44 is on a light illumination side 46.

Figure 3:
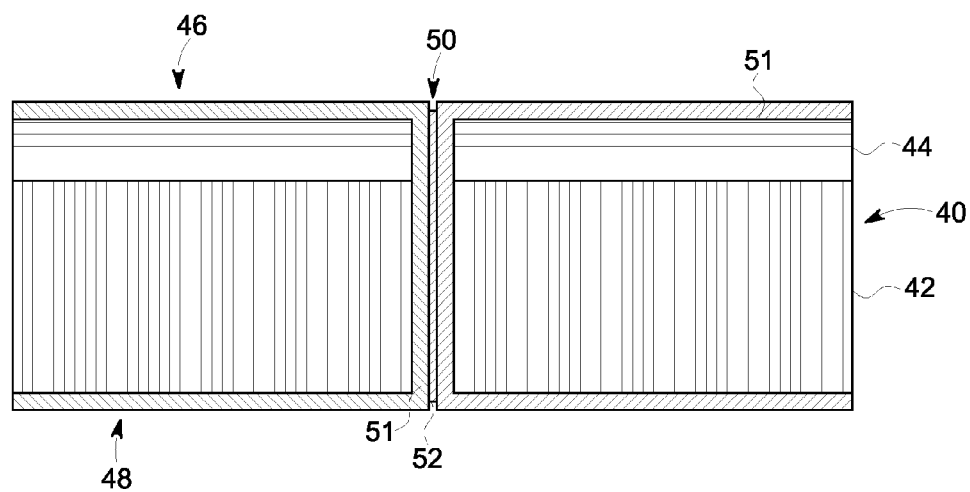

Referring now to FIG. 3, a pre-process through-silicon-via formation step is illustrated. In particular, a via 50, which in one embodiment is a hole extending from the light illumination side 46 to the interconnection side 48 is formed. For example, in one embodiment, any suitable technique may be used to drill a hole through the wafer 40, such as using a plasma etch process. The hole forming the via 50 defines a dielectric isolation layer in various embodiments, which is a conductive through silicon via, for example, with a doped poly-Silicon (Si) refill. In particular, after the via 50 is formed, a dioxide layer 51 is formed on the light illumination side 46, the interconnection side 48, as well as in the via 50 using any suitable technique. For example, a silicon dioxide ($SiO_2$) layer may be thermally grown on the wafer 40, such as in a furnace at an elevated temperature. The oxide growth process on the wafer 40 forms the $SiO_2$ layer on any exposed surfaces.

Thereafter, the via 50 is refilled with a doped poly material 52, which in one embodiment is a P++ poly via refill. In some embodiments, the P++ doping is 2-10 times higher than a P+ doping as described in more detail herein. Accordingly, the via 50 is formed and then a conductive refill is used to fill the via 50 with a doped poly material to form a conductive via. The refill process may be performed using any suitable via filling technique.

Thus, the via 50, which is a TSV, has a heavily doped poly-Si refill that defines the via conductor, which is separated from the substrate, namely the substrate layer 42 and the high resistivity layer 44 by a dielectric layer, namely the $SiO_2$ layer 51. It should be noted that the poly refill has a different doping type than the substrate layer 42 and the high resistivity layer 44.

Figure 4:
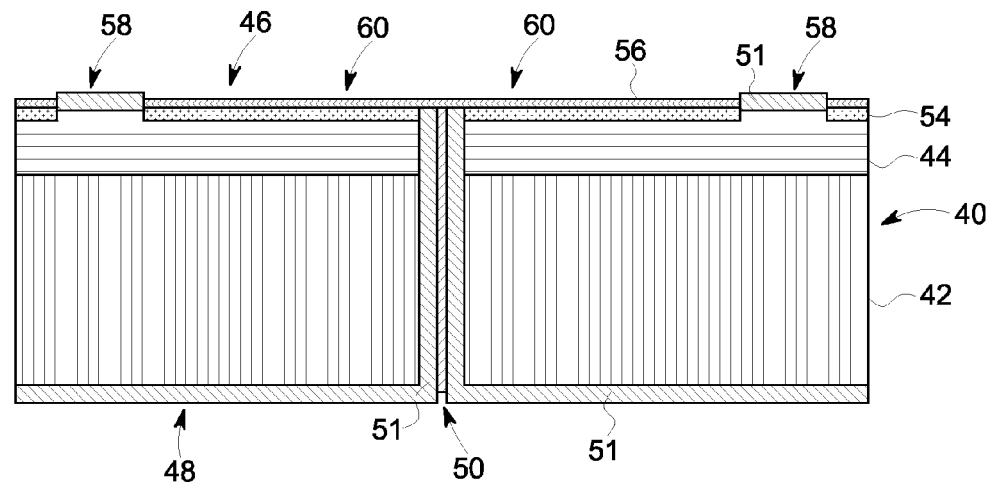

Thereafter, and as shown in FIG. 4, a doped epi layer deposition with pattern etch is performed. This process forms the photodiode array 28, wherein the new epi-layer deposition has the same doping type as the poly refill of the via 50. In particular, in one embodiment, the doped epi-layer is formed on the light illumination side 46 having a same doping type as the poly refill. For example, in one embodiment, a P+ doped epi-layer 54 is first formed following a patterned etch of the $SiO_2$ layer 51 on the light illumination side 46 of the wafer 40, then the epi-layer 54 receives a patterned etch to remove the epi-layer deposition on any remaining SiO2 layer 51. However, the P+ doped epi-layer 54 is not formed over the interconnection side 48. The P+ doped layer 54 may be formed from any suitable process. For example, the P+ doped layer 54 may be formed by (i) a pre-diffusion process wherein the P+ doped layer 54 is driven into the high resistivity layer 44 by a high temperature or (ii) an epi-deposition process, wherein the P+ doped layer 54 is deposited by epitaxial growth.

The epi-layer, which is a P+ doped epi layer 54, is over the via 50. The P+ deposited epi layer is formed, for example, from epitaxial growth over the entire top surface of the light illumination side 46.

Then, a pattern etch is formed such as using a photoresist mask to define openings 58. The openings 58 expose the SiO2 layer 51 thereunder. It should be noted that any suitable etching process may be used Thus, the diode junction (which in this embodiment is a PN junction defining a PN diode) for the photodiodes 60 forming the photodiode array 28 is formed by the P+deposited epi layer 54 and the high resistivity layer 44, the P+deposited epi layer 54 also acts as the connection between the photodiodes 60 and the via 50, in particular the conductive refill (e.g., the doped poly material 52).

Thus, the etching defines the pixelated array structure. Additional processes may be provided, for example, using a suitable diffusion or trench/etching process to isolate adjacent photodiodes 60 from each other. Accordingly, the epi-layer etching forms the pixelated pattern of the photodiode array 28. The additional inter-pixel isolation structure in various embodiments defines a 2D isolation structure. It should be noted that the inter-pixel isolation structure may be formed from an etched trench grid or may be formed by a diffusion grid with the diffusion being the same doping type as the high resistivity layer 44 (e.g., device layer) and being deep enough to reach the substrate 42.

Figure 5:
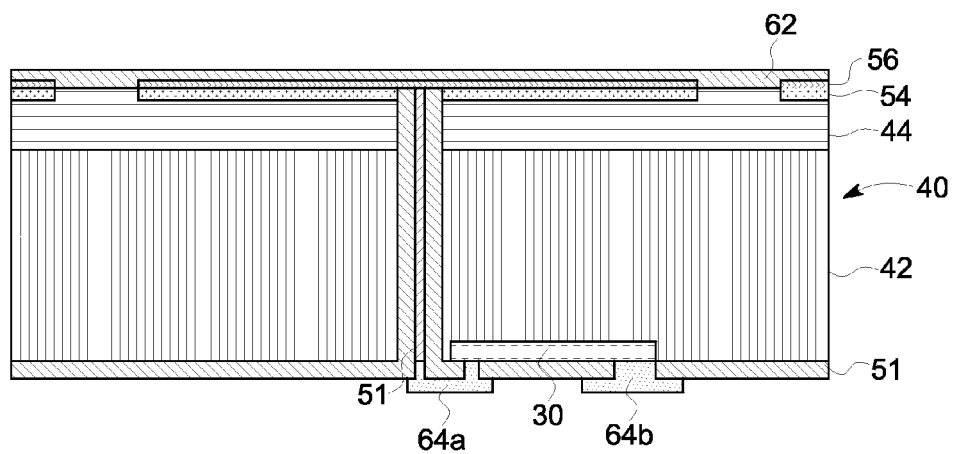

Thereafter, in particular, after the fabrication of the photodiode array 28, a front side coating and a backside fabrication of electronics is provided as shown in FIG. 5. In particular, another $SiO_2$ layer 62 is formed on the light illumination side 46 of the wafer 40. For example, the $SiO_2$ layer 62 is formed by a chemical vapor deposition (CVD) process with relatively low temperature.

The wafer 40 is then flipped over to form electronics, for example, the readout electronics 30, on the interconnection side 48, such as using a CMOS process for electronic component fabrication. The CMOS process may be used because the front side, namely the illumination side 46 of the wafer 40 does not have any metal.

Accordingly, in various embodiments, using CMOS techniques, diode/readout integrated devices are formed on the light illumination side 46 and the interconnection side 48 without using a coordinated double-sided photolithography process. For example, a readout component, such as the readout electronics 30 is formed on the interconnection side 48, which includes metalizations 64a and 64b, which connect the readout electronics 30 to the via 50 and to other components (e.g., detector processing components), respectively.

It should be noted that any suitable CMOS fabrication technique may be used in the fabrication. Also, the various layers also may be formed from any suitable process, such as epitaxial growth as described above or silicon to silicon direct bonding, among others. The process used to form the layers may be based on, for example, the device requirements or the thickness of the layers.

The metallization 64a may define an electrical connector (e.g., an aluminum strip) to electrically connect the via 50 to the readout electronics 30. The metalization 64b may be, for example, data or control interconnect bonds (e.g., epoxy or solder) which are digital signal interconnects in various embodiments. The metalization 64b may be formed from any suitable material, such as metal, solder (e.g., solder bumps or balls) or conductive adhesive (e.g., epoxy plus a filler, such as nickel or graphite), among others. The metalization 64b provides, for example, digital communication and power transmission.

It should be noted that the channel layout for the readout electronics 30 is generally in a pixelated pattern complementary to the arrangement of the photodiodes 60, which may be arranged in a 2D array. However, it should be noted that the channel pitch for the readout electronics 30 may be smaller than the pitch of the array for the photodiodes 60, which provides spacing, such as to include passive components (e.g., power line filtering components).

Thus, a photosensor array and readout electronics arrangement may be provided that includes the photodiode array 28 on one side of a silicon wafer 40 and the readout electronics 30 on a different side of the silicon wafer 40 with interconnections provided by conductive through silicon vias 50 (e.g., vias with heavily doped poly-Si refills). Using this arrangement, in various embodiments, a fully 2D tileable silicon chip for a CT detector module may be provided. For example, the photodiodes 60 may detect light generated from the scintillator 32 (shown in FIG. 1) that is generated based on x-rays or gamma rays impinging on the scintillator 32. The light is converted to electrical current signals by the photodiodes 60, such as for use in CT imaging.

Thus, in various embodiments, the photodiodes 60 correspond to detector pixels and one conductive via 50 is provided per pixel as shown. Thus, the photodiodes 60 form a photo-sensor array. The conductive vias 50 provide electrical connection between the photodiodes 60 and the readout electronics 30. In various embodiments, the readout electronics 30 are provided in a 1:1 or about 1:1 correlation with the pixelated pattern of diodes. The readout electronics 30 may be, for example, an A/D converter implanted or embedded on an opposite side of the wafer to the photodiodes 60.

Figure 6:
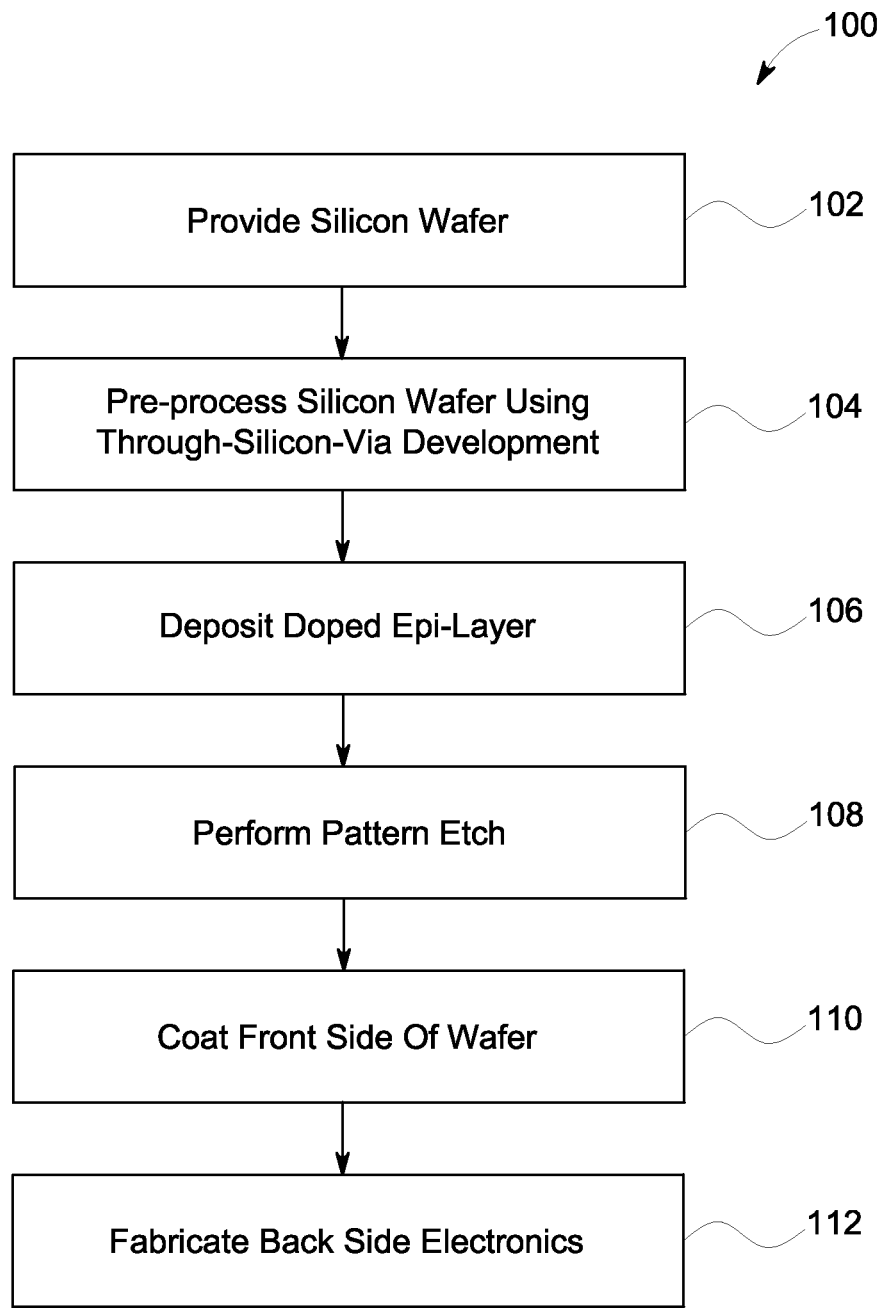
FIG. 6 is a flowchart of a method for forming a photodiode array and readout electronics in accordance with various embodiments.

Various embodiments provide a method 100 as shown in FIG. 6 for forming a photodiode array and readout electronics, for example, a detector module having an integrated photosensor array and readout electronics. In particular, the method 100 includes providing a silicon wafer at 102, which in various embodiments is a multi-layer epi-wafer. Thereafter, the wafer is pre-processed using a through-silicon-via development or process to form conductive vias isolated from the substrate of the wafer as described in more detail herein.

Thereafter, at 106, a doped epi-layer is deposited on an illumination side of the wafer following a patterned etch on the silicon oxide layer. Then the doped epi-layer receives a patterned etch to yield the pixel array. For each photodiode pixel in the array, the doped-epi layer and the substrate form a diode, for example, a PN diode.

The patterned etch of epi-layer is performed at 108 to define pixels on the illumination side as described herein. The front side of the wafer, namely the illumination side is coated at 110. Then back side electronics are formed at 112, for example, by flipping over the wafer. The back side electronics may be formed using CMOS techniques without a coordinated double-sided photolithography process.

Thus, various embodiments provide systems and methods for fabricating a front-lit through-via photodiode array with the diode junctions formed by doped epi deposition. In some embodiments, the fabrication starts with a standard silicon epi-wafer with a high resistivity epi-layer on top of a lower resistivity substrate. After pre-process through-silicon-vias are fabricated on the epi-wafer, the photodiode array is formed by doped epi-layer deposition on the high resistivity layer with patterned etches. The doped epi also provides the connection between the photodiode pixel and the conductive poly refill of the through-silicon-via. Because there is no metal process involved in the photodiode side fabrication, this front-lit through-via photodiode array is not a limiting factor to the possible subsequent processes for the other side. For example, CMOS processes can be used to fabricate readout electronic components at the other side of the wafer to achieve integrated photodiode and readout electronic devices without using non-standard double-sided photolithography processes.

The silicon wafer with integrated photosensor array and readout electronics may be formed into 2D tileable silicon chips, such as through any suitable wafer dicing process. Thereafter the tileable silicon chips may be packaged to form a detector module, such as CT detector module that provides digital inputs/outputs and power supply inputs from the tileable silicon chips.

Figure 7:
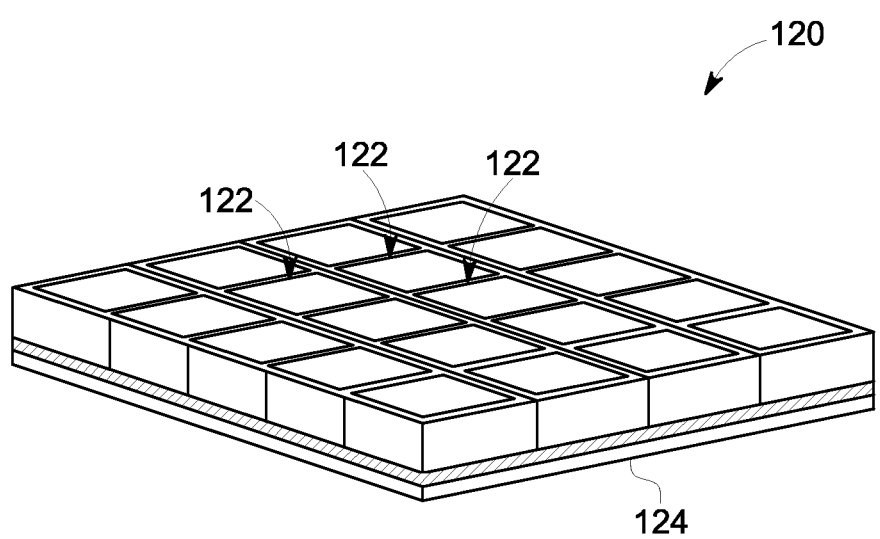
FIG. 7 is a perspective view of a detector module formed in accordance with an embodiment.

For example, as shown in FIG. 7, a plurality of sensor tiles 122 provided in accordance with various embodiments may form a detector module 120. The sensor tiles 122 may include a post-patient collimator, scintillator and the silicon chips with photosensor arrays, such as photodiode arrays and readout electronics formed as described herein. For example, the detector module 120 may be configured as a CT detector module that includes a plurality, for example, twenty sensor tiles 122 arranged to form a rectangular array of five rows of four sensor tiles 122. The sensor tiles 122 are shown mounted on a substrate 124 (e.g., a printed circuit board or other kind of substrate) that may be coupled to processing and/or communication circuitry of a CT system. It should be noted that detector modules 120 having larger or smaller arrays of sensor tiles 122 may be provided. In operation, the x-ray signal detected by the sensor tiles 122 is generally determined from an integration of the total signal charges produced during a pre-defined period of time. However, other forms of signal sampling (e.g., readout of the signal corresponding to each individual x-ray) may be provided.

Figure 8:
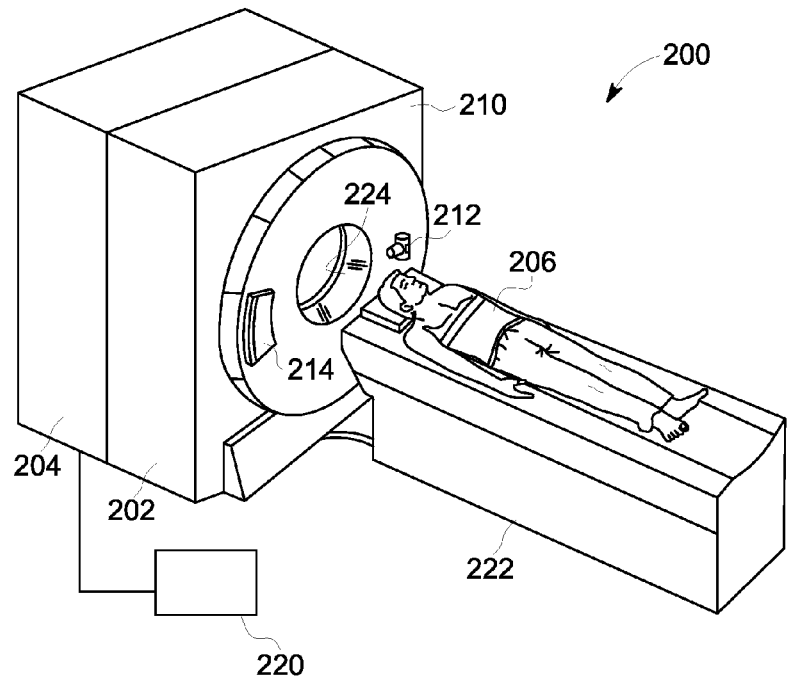
FIG. 8 is a pictorial drawing of an exemplary embodiment of an imaging system in which a detector module having a photodiode array of various embodiments may be implemented.
Figure 9:
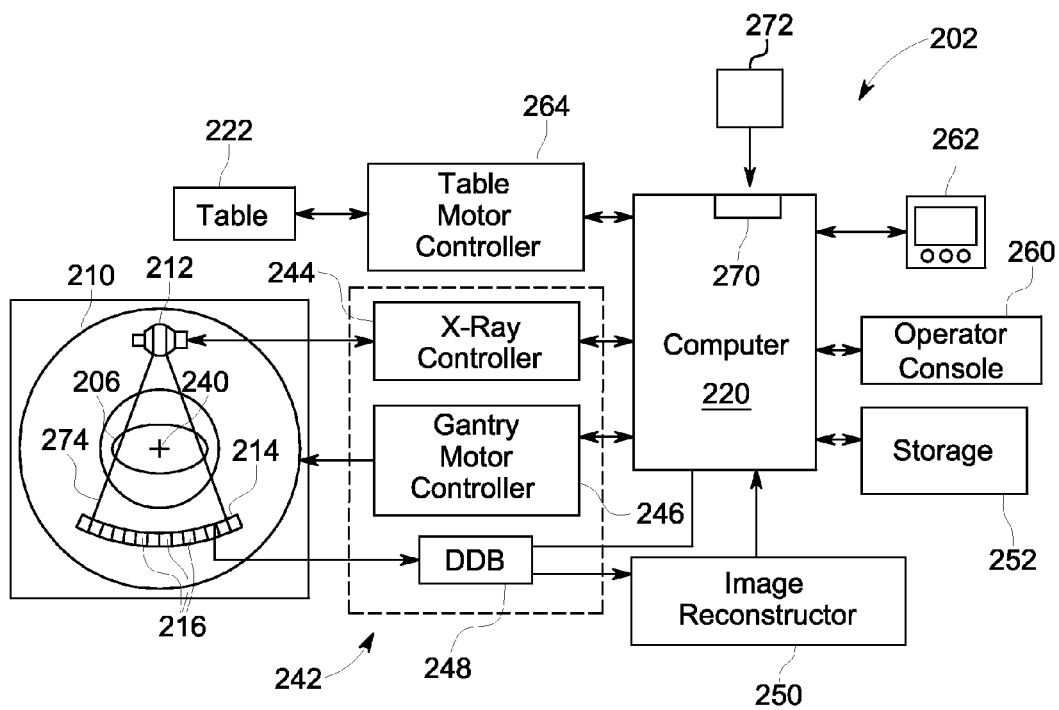
FIG. 9 is a schematic block diagram of the imaging system shown in FIG. 8.

The various embodiments may be implemented in connection with different types of imaging systems. For example, FIG. 8 is a pictorial view of an exemplary imaging system 200 that is formed in accordance with various embodiments. FIG. 9 is a block schematic diagram of a portion of the imaging system 200 shown in FIG. 8. Although various embodiments are described in the context of an exemplary dual modality imaging system that includes a computed tomography (CT) imaging system and a positron emission tomography (PET) imaging system, it should be understood that other imaging systems capable of performing the functions described herein are contemplated as being used, including single modality imaging systems.

The multi-modality imaging system 200 is illustrated, and includes a CT imaging system 202 and a PET imaging system 204. The imaging system 200 allows for multiple scans in different modalities to facilitate an increased diagnostic capability over single modality systems. In one embodiment, the exemplary multi-modality imaging system 200 is a CT/PET imaging system 200. Optionally, modalities other than CT and PET are employed with the imaging system 200. For example, the imaging system 200 may be a standalone CT imaging system, a standalone PET imaging system, a magnetic resonance imaging (MRI) system, an ultrasound imaging system, an x-ray imaging system, and/or a single photon emission computed tomography (SPECT) imaging system, interventional C-Arm tomography, CT systems for a dedicated purpose such as extremity or breast scanning, and combinations thereof, among others.

The CT imaging system 202 includes a rotation gantry 210 that has an x-ray source 212 that projects a beam of x-rays toward a detector array 214 on the opposite side of the gantry 210. The detector array 214 includes a plurality of detector elements 216 that are arranged in rows and channels that together sense the projected x-rays that pass through an object, such as the subject 206, and which may be configured as multiple detector modules according to one or more embodiments described herein. The imaging system 200 also includes a computer 220 that receives the projection data from the detector array 214 and processes the projection data to reconstruct an image of the subject 206. In operation, operator supplied commands and parameters are used by the computer 220 to provide control signals and information to reposition a motorized table 222. More specifically, the motorized table 222 is utilized to move the subject 206 into and out of the gantry 210. Particularly, the table 222 moves at least a portion of the subject 206 through a gantry opening 224 that extends through the gantry 210.

As discussed above, the detector 214 includes a plurality of detector elements 216. Each detector element 216 produces an electrical signal, or output, that represents the intensity of an impinging x-ray beam and hence allows estimation of the attenuation of the beam as it passes through the subject 206. During a scan to acquire the x-ray projection data, the gantry 210 and the components mounted thereon rotate about a center of rotation 240. The multislice detector array 214 includes a plurality of parallel detector rows of detector elements 216 such that projection data corresponding to a plurality of slices can be acquired simultaneously during a scan.

Rotation of the gantry 210 and the operation of the x-ray source 212 are governed by a control mechanism 242. The control mechanism 242 includes an x-ray controller 244 that provides power and timing signals to the x-ray source 212 and a gantry motor controller 246 that controls the rotational speed and position of the gantry 210. A digital data buffer (DDB) 248 in the control mechanism 242 receives and store the digital data from the detector 214 for subsequent process. An image reconstructor 250 receives the sampled and digitized x-ray data from the DDB 248 and performs high-speed image reconstruction. The reconstructed images are input to the computer 220 that stores the image in a storage device 252. Optionally, the computer 220 may receive the sampled and digitized x-ray data from the DDB 248. The computer 220 also receives commands and scanning parameters from an operator via a console 260 that has a keyboard. An associated visual display unit 262 allows the operator to observe the reconstructed image and other data from computer.

The operator supplied commands and parameters are used by the computer 220 to provide control signals and information to the DDB 248, the x-ray controller 244 and the gantry motor controller 246. In addition, the computer 220 operates a table motor controller 264 that controls the motorized table 222 to position the subject 206 in the gantry 210. Particularly, the table 222 moves at least a portion of the subject 206 through the gantry opening 224 as shown in FIGS. 8 and 9.

Referring again to FIG. 9, in one embodiment, the computer 220 includes a device 270, for example, a floppy disk drive, CD-ROM drive, DVD drive, magnetic optical disk (MOD) device, or any other digital device including a network connecting device such as an Ethernet device for reading instructions and/or data from a computer-readable medium 272, such as a floppy disk, a CD-ROM, a DVD or an other digital source such as a network or the Internet, as well as yet to be developed digital means. In another embodiment, the computer 220 executes instructions stored in firmware (not shown). The computer 220 is programmed to perform functions described herein, and as used herein, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein.

In the exemplary embodiment, the x-ray source 212 and the detector array 214 are rotated with the gantry 210 within the imaging plane and around the subject 206 to be imaged such that the angle at which an x-ray beam 274 intersects the subject 206 constantly changes. A group of x-ray attenuation measurements, i.e., projection data, from the detector array 214 at one gantry angle is referred to as a "view". A "scan" of the subject 206 comprises a set of views made at different gantry angles, or view angles, during one revolution of the x-ray source 212 and the detector 214. In a CT scan, the projection data is processed to reconstruct an image that corresponds to a two dimensional slice taken through the subject 206.

Exemplary embodiments of a multi-modality imaging system are described above in detail. The multi-modality imaging system components illustrated are not limited to the specific embodiments described herein, but rather, components of each multi-modality imaging system may be utilized independently and separately from other components described herein. For example, the multi-modality imaging system components described above may also be used in combination with other imaging systems.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, Reduced Instruction Set Computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A photodiode array comprising:
   a silicon substrate having a first surface and an opposite second surface;
   a plurality of conductive vias through the silicon substrate; and
   a patterned doped epitaxial layer on the first surface, the patterned doped epitaxial layer and the substrate forming a plurality of diode junctions, wherein a patterned etching defines an array of the diode junctions, the patterned doped epitaxial layer further forming a non-conductive interconnect with and overlaying the plurality of conductive vias.

2. The photodiode array of claim 1, wherein the silicon substrate comprises a high resistivity epitaxial layer having the first surface.

3. The photodiode array of claim 2, wherein the silicon substrate comprises a substrate layer, the high resistivity epitaxial layer having a higher resistivity than the substrate layer, wherein the high resistivity epitaxial layer and the substrate layer have a same doping type.

4. The photodiode array of claim 1, wherein the plurality of conductive vias comprise therein a doped poly-Silicon refill.

5. The photodiode array of claim 4, wherein the doped poly-Silicon refill having a different doping type than the silicon substrate.

6. The photodiode array of claim 4, wherein the doped poly-Silicon refill having a same doping type as the doped epitaxial layer on the first surface.

7. The photodiode array of claim 1, further comprising a dielectric layer separating the plurality of conductive vias from the silicon substrate.

8. The photodiode array of claim 7, wherein the dielectric layer comprises a silicon dioxide ($SiO_2$) layer.

9. The photodiode array of claim 1, wherein the doped epitaxial layer electrically connects the plurality of diode junctions and the plurality of conductive vias through a non-metallic pathway formed from the non-conductive interconnect.

10. The photodiode array of claim 1, further comprising complementary metal-oxide-semiconductor (CMOS) electronics on the second surface, the CMOS electronics electrically connected to the plurality of diode junctions with the plurality of conductive vias.

11. The photodiode array of claim 1, wherein the silicon substrate is a multi-layer N-doped silicon and the doped epitaxial layer is P-doped.

12. The photodiode array of claim 11, wherein the doped epitaxial layer is a P+ type doped layer.

13. The photodiode array of claim 12, wherein the plurality of conductive vias comprise therein a doped poly-Silicon refill having a P++ type doped poly refill.

14. A detector comprising:
    a silicon substrate having a first surface and an opposite second surface;
    a plurality of conductive vias through the silicon substrate;
    a plurality of photodiodes formed at the first surface from a doped epitaxial layer, the doped epitaxial layer further forming a non-conductive pathway to and overlaying the plurality of conductive vias such that the plurality of photodiodes are connected to the plurality of conductive vias to allow current flow from the plurality of photodiodes to the plurality of vias without a metal interconnect; and
    readout electronics formed on the opposite second surface, wherein the plurality of photodiodes and the readout electronics are electrically connected by the plurality of conductive vias.

15. The detector of claim 14, wherein the readout electronics comprise complementary metal-oxide-semiconductor (CMOS) electronics.

16. The detector of claim 14, wherein the silicon substrate comprises a high resistivity epitaxial layer having the first surface and a substrate layer, the high resistivity epitaxial layer having a higher resistivity than the substrate layer, wherein the high resistivity epitaxial layer and the substrate layer have a same doping type.

17. The detector of claim 14, wherein the plurality of conductive vias comprise therein a doped poly-Silicon refill having a different doping type than the silicon substrate and the doped poly-Silicon refill having a same doping type as a doped epitaxial layer on the first surface.

18. The detector of claim 14, further comprising a dielectric layer separating the plurality of conductive vias from the silicon substrate.

19. A method for fabricating a photodiode array, the method comprising:
    pre-processing a silicon substrate using a conductive through-silicon-via process to form a plurality of vias through the silicon substrate;
    depositing a doped epitaxial layer on a surface of the pre-processed silicon substrate to form a plurality of diode junctions, wherein the doped epitaxial layer forms a non-conductive interconnect with and overlaying the plurality of conductive vias; and
    etching a pattern on the surface to define an array of the diode junctions.

20. The method of claim 19, further comprising fabricating complementary metal-oxide-semiconductor (CMOS) electronics on a surface of the pre-processed silicon substrate opposite the surface with the doped epitaxial layer and forming a photodiode junction using a non-ion implant process.

* * * * *